United States Patent
Navon et al.

(10) Patent No.: US 9,583,196 B2
(45) Date of Patent: Feb. 28, 2017

(54) IMMEDIATE FEEDBACK BEFORE OR DURING PROGRAMMING

(71) Applicant: SanDisk Technologies LLC, Plano, TX (US)

(72) Inventors: Ariel Navon, Revava (IL); Eran Sharon, Rishon Lezion (IL); Alexander Bazarsky, Holon (IL); Noam Presman, Givatayim (IL)

(73) Assignee: SanDisk Technologies LLC, Plano, TX (US)

( * ) Notice: Subject to any disclaimer, the term of this patent is extended or adjusted under 35 U.S.C. 154(b) by 50 days.

(21) Appl. No.: 14/607,408

(22) Filed: Jan. 28, 2015

(65) Prior Publication Data

US 2016/0217858 A1     Jul. 28, 2016

(51) Int. Cl.

| G11C 11/34 | (2006.01) |
| G11C 16/10 | (2006.01) |
| G11C 16/34 | (2006.01) |
| G11C 16/12 | (2006.01) |
| G11C 29/02 | (2006.01) |

(52) U.S. Cl.
CPC ............. *G11C 16/10* (2013.01); *G11C 16/12* (2013.01); *G11C 16/3427* (2013.01); *G11C 16/3486* (2013.01); *G11C 29/021* (2013.01); *G11C 29/028* (2013.01)

(58) Field of Classification Search
CPC .............................. G11C 16/10; G11C 16/349
USPC ............ 365/185.24, 185.02, 185.03, 185.04, 365/185.09, 185.14, 185.18, 129, 365/189.011, 200, 201
See application file for complete search history.

(56) References Cited

U.S. PATENT DOCUMENTS

| 8,675,417 B2 | 3/2014 | Litsyn et al. |
| 2003/0142546 A1* | 7/2003 | Yano .................. G11C 16/3404 365/185.22 |
| 2014/0229774 A1* | 8/2014 | Melik-Martirosian .......... G06F 11/076 714/704 |

* cited by examiner

*Primary Examiner* — Fernando Hidalgo
(74) *Attorney, Agent, or Firm* — Stoel Rives LLP (57) ABSTRACT

A system and method of programming user data into a memory cell includes receiving a first user data to be programmed in a memory controller, selecting a memory cell for programming the first user data and measuring at least one health characteristic of the selected memory cell. At least one programming parameter of the selected memory cell is adjusted and the first user data is programmed to the selected memory cell using the adjusted programming parameter corresponding to the selected memory cell.

19 Claims, 6 Drawing Sheets

IMMEDIATE FEEDBACK BEFORE OR DURING PROGRAMMING

FIELD OF THE INVENTION

The present invention relates generally to systems and methods for programming a memory cell array, and more particularly, to systems and methods for determining an optimum programming settings before or during programming the memory cell.

BACKGROUND

Programming arrays of memory cells tend to suffer from noise which is related to various sources. Several noise sources are related to the programming and/or read signals from nearby memory cells. Other noises sources are caused during the device service life and are related either to physical deterioration of the memory cell or to charge drift due to age, temperature, operational cycles and other reasons.

Memory arrays are tested at the completion of production. The programming tests allow programming settings to be calibrated for each memory cell or, for a representative sampling of memory cells in the memory array, so that low limit performance memory cells are programmed correctly. In this manner a memory cell that exhibits low programming performance, such as having a slow programming duration or that it requires a high programming current and other less than optimum programming settings—is identified as a low limit performance memory cell. The programming settings for the low limit performance worst case memory cell are then applied to all the memory cells in the memory array or a selected subgroup of memory cells selected from the memory array.

The worst case programming settings are usually more severe (e.g. slower) comparing to the programming setting at which a majority of the memory cells in the memory array could be programmed, and thus unnecessarily slows the programming duration for the entire memory array, or dictates a higher programming pulses etc. Further, the programming settings for the worst case memory cell do not account for other factors such as dynamic noise and memory cell degradation over time. The programming settings for the low limit performance memory cell will eventually no longer reflect the actual worst case settings of the worst case memory cell or other memory cells in the memory array as the memory cell performance degrades over time. As a result, even executing the slow programming, higher current settings for the worst case memory cell will result in programming errors and premature failures of memory arrays.

SUMMARY

Broadly speaking, the present invention fills these needs by providing a system and method of reducing memory cell programming noise and increasing memory cell data retention and reliability. It should be appreciated that the present invention can be implemented in numerous ways, including as a process, an apparatus, a system, computer readable media, or a device. Several inventive embodiments of the present invention are described below.

One embodiment provides a method of programming user data into a memory cell including receiving a first user data to be programmed in a memory controller, selecting a memory cell for programming the first user data and measuring at least one health characteristic of the selected memory cell. At least one programming parameter of the selected memory cell is adjusted and the first user data is programmed to the selected memory cell using the adjusted programming parameter corresponding to the selected memory cell. As mentioned above such a procedure could be done also during programming. By receiving indication from preliminary programming responses of the cells, and adjusting the continuation of the programming accordingly such as the same target cell, or to the relevant relationship to neighboring memory cells.

Measuring the health characteristics of the selected memory cell, adjusting the programming parameters of the selected memory cell and programming the first user data to the selected memory cell can occur in immediate succession when the selected memory cell is selected for programming the first user data.

The selected memory cell can be one of a group of memory cells, each of the memory cells in the group of memory cells can be related such as having a similar access frequency (e.g., how often the memory cell is accessed), a similar average bit error rate (BER), physically neighboring memory cells and/or memory cells which share common physical structure such as a common gate line, a common source or a common drain lines, time in service, temperature or electrical properties and which can predicted to have similar measured health characteristics. Adjusting the programming parameters of the selected memory cell can include adjusting the programming parameters of the group of memory cells. The adjusted programming parameter for the group of memory cells can also be stored for future use. When a second user data is received by the memory controller, to be programmed into the memory system, the group of memory cells having the stored, equally measured health characteristic can be selected and the second user data can be programmed to the group of memory cells using the stored, adjusted programming parameter for the group of memory cells.

A second portion of the first user data can also be programmed to a second memory cell using the adjusted at least one programming parameter corresponding to the selected memory cell, when the second memory cell shares a common wordline with the selected memory cell. Measuring the at least one of the health characteristics of the selected memory cell and the programming the first user data to the selected memory cell can occur simultaneously.

Measuring the health characteristics of the selected memory cell, adjusting the programming parameters of the selected memory cell and the programming the first user data to the selected memory cell can also occur after at least one of a selected number of programming cycles for the selected memory cell or a selected period of time in service for the selected memory cell.

Measuring the health characteristics of the selected memory cell can include selecting one of the health characteristics of the selected memory cell, applying an appropriate test corresponding to the selected health characteristic and receiving a measured selected health characteristic of the selected memory cell.

Adjusting the programming parameters of the selected memory cell can include selecting one of the programming parameters of the selected memory cell for adjustment, calculating an adjustment for the selected programming parameter corresponding to a target programming result for the selected memory cell and adjusting the selected programming parameters of the selected memory cell corresponding to the target programming result for the selected memory cell. The adjustable programming parameters can includes one or more of a programming pulse width, a programming pulse amplitude, a programming pulse step size, a selected number of programming pulses or a compliance current.

Another embodiment provides a memory system including a memory controller, a memory array including multiple memory cells. The memory array can be coupled to the memory controller by a bus. A health characterization logic including logic for measuring at least one health characteristic of a selected one of the memory cells and a programming parameter adjust logic including logic for adjusting programming parameters of the selected memory cell and a programming circuit including logic for programming the first user data to the selected memory cell using the adjusted programming parameter corresponding to the selected memory cell. The health characterization logic and the programming parameter adjust logic can be included in a common die with the memory array or the memory controller.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for reducing programming noise and increasing data retention and reliability will now be described. It will be apparent to those skilled in the art that the present invention may be practiced without some or all of the specific details set forth herein.

Noise reduction is a major goal of memory designers at the memory array level, the controller design and operations and at the firmware level. As described above there are numerous sources of noise. The disclosed new approach to reducing the noise of the data placed at memory cells includes receiving an up to date indication to the functionality and reliability of each individual memory cell or groups of memory cells before and/or during programming the memory cell(s). The programming parameters for each individual memory cell can then be adjusted accordingly to minimize the noise produced during the programming of that memory cell. Adjusting the programming parameters includes a fine resolution tuning of the programming parameters for each individual memory cell or a selected group of related memory cells. The disclosed approach avoids the severe programming parameter limitations imposed by slowest memory cells and broadly applied to all memory cells in the memory array.

There are several types of noises which occur during the programming operations of the memory array. Example noise sources include program disturb, over-programming (due to "Fast-cells"), the Yupin effect, the Nakamura (effect) etc. When applying programming signal to a group of memory cells the threshold voltage ($V_{Threshold}$) of the memory cell increases to correspond with the charge of the floating gate of the memory cell. However, this charge on the floating gate is not deterministic and constant from one memory cell to another memory cell. Even for the same memory cell there may be variations in the precise response to applied voltage or current during different programming operations.

Programming disturb can occur when reading a target memory cell. When a target memory cell is read or programmed, a $V_{Pass}$ voltage is applied to the neighboring wordlines and thus the gates of the memory cells connected to the neighboring wordlines. The $V_{Pass}$ voltage is a relatively high voltage. The $V_{Pass}$ voltage maintains the memory cells connected to the neighboring wordlines in an "open" condition during the reading or programming of the target wordline. The recurring application of the $V_{Pass}$ voltage has wearing effect on those memory cells connected to the neighboring wordlines and affects the memory cells and the data contained in the memory cells. The programming disturb is expressed usually in a longer "tail" of the erase state.

Yupin and Enda effects, also known as cross coupling effects, can occur after a target memory cell was programmed in a specific voltages or charges composition of the neighboring memory cells, and read in different states or voltages composition of the neighboring memory cells. Yupin effect relates to induction from a floating gate of a neighboring memory cell to the floating gate of the target memory cell, whereas Enda effect relates to induction from the common-gate of a neighboring memory cell to the floating gate of the target memory cell.

Over programming noise also relates to the variance between target memory cells. Certain memory cells are programmed faster than other memory cells. As a result, the faster programming memory cells can experience excessive programming voltage.

Figure 1:
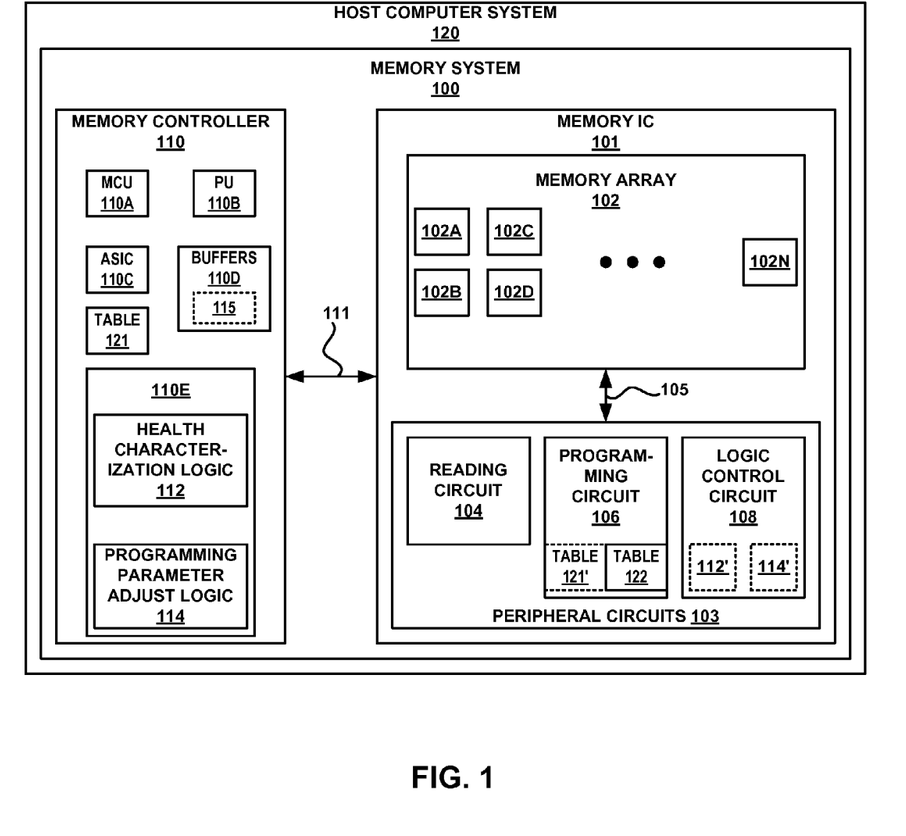
FIG. 1 is a block diagram of a memory system, for implementing embodiments of the present disclosure.

Typically, the programming parameters for a memory array are determined in the factory and set for the operational life of the memory array. Determining the programming parameters includes correlating memory cell performance characteristics of programming speed, programming noise level, programming accuracy, and impact on memory cell durability (e.g., service life) to different applied programming parameters. The operating firmware or even a lower-level hardware module(s) (e.g., programming circuit 106 and/or logic control circuit 108) could utilize the feedback collected before and/or during programming of each memory cell to adjust the programming parameters such that allows a trade-off between programming speed and the reliability of the programmed data (e.g., the quality of the programmed data). The speed of the programming procedure can stand in an opposite relation to the quality of the programmed data. The quality of the data can correspond to the accuracy of the programmed data and/or the noise level and/or bit error rate measurement, etc.

The programming parameters that can be adjusted include pulse widths, pulse amplitudes, pulse amplitude step size, numbers of pulses, compliance current applied during the programming pulses and the differentiation between set/reset operations. The set and reset operations refer to transitions of the memory cell from a high resistance state to a low resistance state and via versa, and generally differentiate between memory cell data storage value transitions from a logical 0 to a logical 1 and from a logical 1 to a logical 0. In a similar manner, multi level cell (MLC) programming, which programs multiple bits into a single memory cell, could also be supported as disclosed herein.

The correlated programming parameters to performance of each memory cell can be stored for future use by the firmware. In one implementation, the correlated programming parameters to performance of each memory cell can be stored in one or more latches in the memory system controller. By way of example, if the correlated programming parameters to performance are determined for a selected number of or a selected group of memory cells, then the correlated programming parameters for the number or group of memory cells may be stored, for future usage, in either the controller memory or a non-volatile memory location.

The correlated programming parameters for one or more memory cells can be written in an internal RAM or in designated registers, or to be handled in any other suitable manner such as updating a time-tagging table and/or a bad-regions table etc. In this manner, the correlated programming parameters for one or more memory cells could be used for a future decision regarding adjusting the programming parameters or to update a time-tagging table and/or a bad-columns or a bad regions table etc.

In another implementation, the correlated programming parameters for one or more memory cells can be handed to one or more internal hardware module(s) that will automatically adjust the programming parameters for the corresponding memory cells.

Alternatively, the correlated programming parameters to performance of each memory cell may not be stored and are immediately used for the present memory cell programming operation and then discarded. Future programming operations for the same memory cell would be based on the programming parameters for the memory cell as determined at the time of the future programming the memory cell.

The firmware can use the correlated programming parameters to performance for each memory cell or group of memory cells under several different sets of programming parameters to choose a selected set of programming parameters to be optimized for a selected use to apply to program that memory cell or group of memory cells. For example, if speed is more important than the retention time for the data in the memory cells, then a set of programming parameters that allows the selected memory cell or group of memory cells to be programmed in the shortest amount of time can be chosen, before programming the selected memory cell or group of memory cells.

Conversely, if programming speed can be sacrificed to gain storage capacity, then the programming parameters can be trimmed or adjusted to allow the selected memory cell or group of memory cells to be programmed with the most number of bits in each memory cell can be chosen, before programming the selected memory cell or group of memory cells. The programming parameters can be trimmed so that a tradeoff can be made between programming speed, memory cell service life and endurance and data retention duration.

Determining the programming parameters can be accomplished as often as before every time the memory cell or group of memory cells is programmed. In another implementation, a periodic programming parameters testing can be applied to update the programming parameters for each memory cell or group of memory cells as the memory cell performance can change with age. The periods between determining the programming parameters may be measured in time or in programming cycles.

In some instances a memory cell can be determined to have low limit performance for some uses and acceptable performance for other uses or low limit performance for all uses. In the prior art, when a memory cell fails one test in the factory testing, the memory cell is disabled for all uses, for the entire service life of the memory array. Memory cells identified to be low limit performance for all uses can be disabled at the firmware level or in lower hardware modules. Memory cells identified as being low limit performance for some uses are disabled whenever the corresponding low limit performance use is called for. Memory cells identified as being good for some uses can be available to those "good" uses only.

An example here is where a selected memory cell may only be reliable at storing 2 data levels (1 bit) where other, healthier memory cells can store 8 data levels (3 bits), under the same programming parameters. In a high memory capacity use where data storage density of 3 bits per memory cell is needed, the selected memory cell would be disabled. This indication nature data can be used to supply information to the memory controller. In case of a Low Density Parity Check (LDPC) Error Correction Code Engine, such information about the memory cell health could be used to allow a more accurate "soft information" that in turn could help the memory controller to decode the data after it is read, and improve the correction capability and/or performance of the memory system.

FIG. 1 is a block diagram of a memory system 100, for implementing embodiments of the present disclosure. The memory system 100 is coupled to or included as part of a host computer system 120. The memory system 100 includes one or more memory integrated circuits 101. The memory integrated circuits 101 include a memory array 102. The memory array 102 includes many memory cells arranged in logical blocks 102A-n of memory cells (e.g., memory blocks 102A-n).

The memory integrated circuits 101 can also include peripheral circuits 103 coupled to the memory array 102 buy a bus 105. The bus 105 is coupled to sets of wordlines, bitlines and steering gate control lines for each of the memory blocks 102A-n. The peripheral circuits can include reading circuits 104, programming circuits 106, and logic control circuits 108, for reading, writing and steering gates for controlling the memory blocks 102A-n, respectively.

The memory system 100 also includes a memory controller 110. The memory controller 110 is coupled to one or more memory integrated circuits 101 by a bus 111. The memory controller 110 can include circuits for controlling the memory system 100 such as a memory control unit 110A, a processor 110B, an application specific integrated circuit (ASIC) 110C, random access memory buffers 110D and memory controller logic 110E.

The memory controller logic 110E includes interfacing protocols between the memory controller 110 and the memory blocks 102A-n and between the memory system 100 and the host computer system 120. The memory controller logic 110E can include software and firmware that is executable by the processor 110B. The memory controller logic 110E can include memory cell health characterization logic 112 and a programming parameter adjustment logic 114. Alternatively or additionally, the logic control circuits 108 can include the memory cell health characterization logic 112' and the programming parameter adjustment logic 114'. The health characterization logic 112, 112' and the programming parameter adjustment logic 114, 114' can be used as described in more detail below.

The memory blocks 102A-n can include nonvolatile memory (NVM) such as flash memory (e.g., NAND flash) and other types of memory such as NOR, ORNAND, 3D memory and charge trapping memory with material such as silicon nitride, and phase change memory such as ReRAM, and semi-volatile memory such as DRAM and SRAM. The memory blocks 102A-n can also include volatile type memory circuits. The volatile type memory circuits can include, as an example, dynamic random access memory (DRAM) and static random access (SRAM) memory circuits.

The reliability of the user data storage in the memory block can be improved using the principles disclosed below for any type of memory that includes any type of memory cell. While the following examples discuss using a wordlines in order to indicate a relevant neighbor cells (or similar cells), similar processes can be applied instead to cells that share the same bitline of or any memory cells that are related to target cell (either physically or in other manner). Related memory cells can include memory cells that share a similar access frequency (e.g., how often the memory cell is accessed), a similar average bit error rate (BER, meaning similar percentage of bits that were flipped from their programmed value), such as having a similar percentage of bits that were, physically neighboring memory cells such as memory cells within a selected distance from the target memory cell. Other relationships can include sharing a common physical structure including a common gate lines or a common drain or a common source. Other relationships can include memory cells having a similar time in service, a common average temperature history or one or more common electrical properties. Not all memory types will use the wordline or bitline terms. For example reRAM memory may use terms such as finger, branch, or comb.

As described above, reducing the noise generation during programming provides a more reliable programming operation. There are many approaches to reducing programming noise levels.

One approach to reducing programming noise levels is to use trimmed programming parameters having a slower programming duration for the entire memory array. However, slowing the programming duration reduces the overall memory programming performances of the memory array.

Another approach to reducing programming noise levels uses programming noise feedback for noise reduction through coset coding such as described in commonly owned, U.S. Pat. No. 8,675,417, by Lisyn et al. (hereinafter the '417 patent) However, the coset coding approach of the '417 patent is very complex and can increase the actual programming duration for each memory cell and the memory array overall.

The disclosed embodiments include measuring a functional health measure of the memory cells that are to be programmed immediately before and/or during the programming of the memory cell.

The health measurement information can then be used for adjusting the programming parameters to compensate for the indicated weaknesses in the of the memory cell and to take advantage of the indicated strengths of the memory cell. This approach is highly suited for memories which provide bit level read and write access, such as ReRAM and other post NAND technologies. The health measurement information can be stored for later use or discarded and reacquired when the selected memory cell(s) is to be programmed during a future programming time.

Some of the health measurements providing of the memory cell health may be obtained as a programming process by-product, e.g., measuring a background leakage current. Another example of a byproduct health measurement or indication can include checking a response of the memory cell to the first pulses of the programming process and then adjusting the remaining programming pulses accordingly. More specifically, if the cell responds positively to the applied programming pulses, the remaining programming pulses may be increased.

Other health measurements can be obtained during a specific test pulse and checking the memory cell response. For example measuring the corresponding increase in its $V_{Threshold}$ in response to the test pulses.

The disclosed embodiments are different from the methods described in U.S. Pat. No. 8,675,417, which obtain the feedback during the programming operation and not prior to the programming operation. Further, U.S. Pat. No. 8,675,417 responds to the obtained feedback by correspondingly altering the programmed codeword. In contrast, the disclosed embodiments adjust the programming parameters.

Figure 2:
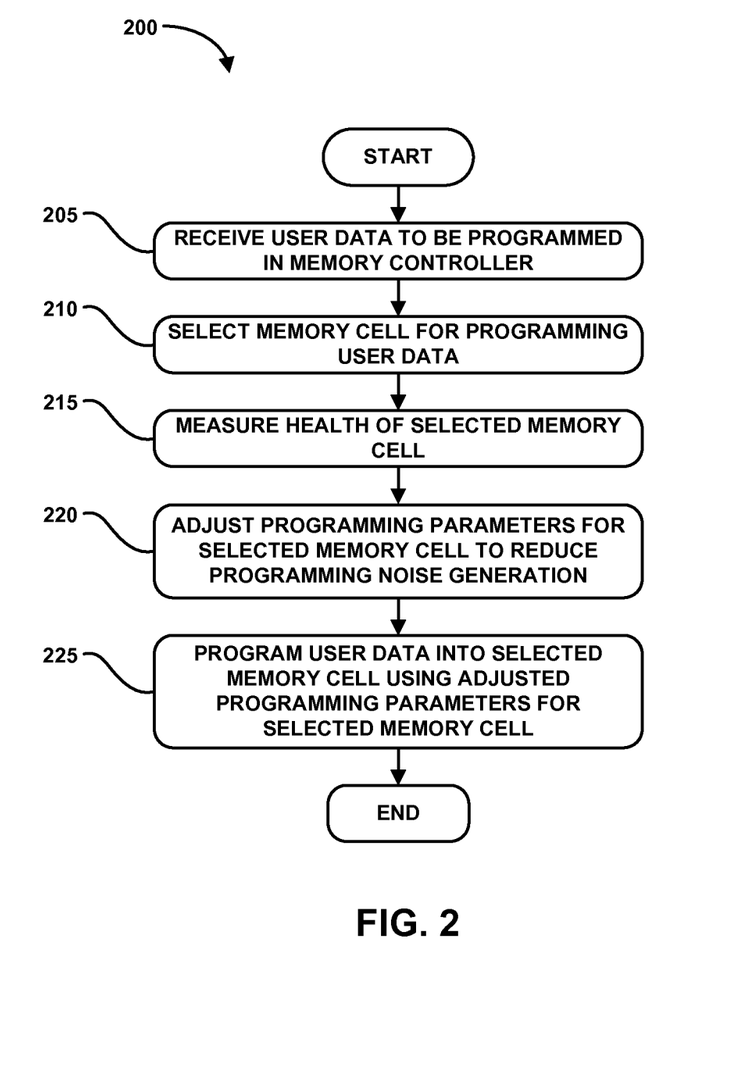
FIG. 2 is a flowchart diagram that illustrates the method operations performed in programming a memory cell, for implementing embodiments of the present disclosure.

FIG. 2 is a flowchart diagram that illustrates the method operations 200 performed in programming a memory cell, for implementing embodiments of the present disclosure. In an operation 205, a quantity of user data is received in the memory controller 110 to be programmed into or written to or otherwise stored in the memory system 100.

In an operation 210, a memory cell 102A is selected for programming. The health of the selected memory cell 102A is measured in an operation 215. The memory cell health can be measured by identifying the selected memory cell's quality and characteristic immediately before programming the selected memory cell 102A. Alternatively, the selected memory cell health can be measured during programming of the selected memory cell 102A. The measurement of the memory cell's health is described in more detail in FIG. 3 below.

In an operation 220, the programming parameters for the selected memory cell 102A are adjusted to correspond to and/or as a function of the measured health of the selected memory cell and to reduce the noise generated during programming the selected memory cell. In an operation 225, the user data is programmed into the selected memory cell 102A using the adjusted programming parameters and the method operations can end.

Receiving the health information regarding the selected memory cell, just before programming data to the selected memory cell, provides a present time programming reliability indication. The programming parameters can then be adjusted in order to reduce the noise attributed to programming the data in the selected memory cell. Each of the programming parameters can be adjusted for each individual memory cell to optimize the programming of each memory cell to meet a desired goal such as reducing noise generation caused by the programming of the memory cell. Adjusting the programming parameters for each individual memory cell allows a trade-off of programming speed and reliability, thereby enabling faster programming for more healthy memory cells as opposed to having fixed slower programming parameters applied to all memory cells in the memory array as might be dictated by the low limit performance memory cell or group of memory cells or representative memory cell.

The health of the selected memory cell is measured as described in operation 215 above and in more detail in FIG. 3 below. The health of the selected memory cell can be measured by a number of different approaches. In one implementation, the health of the selected memory cell is measured by measuring a background leakage current of the selected memory cell. In another implementation the existing verify-operations can be used to measure health of the selected memory cell by comparing the results of the verify operations to a corresponding expected value, threshold, or behavior.

Figure 3:
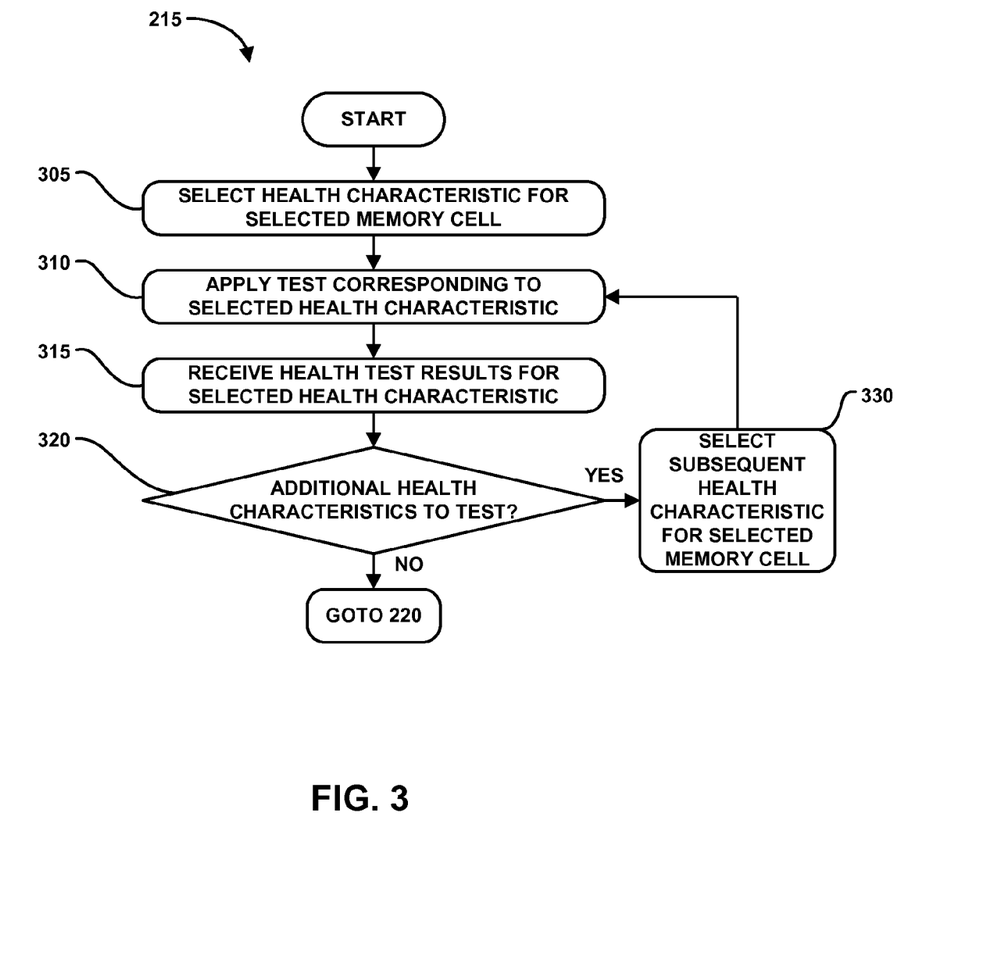
FIG. 3 is a flowchart diagram that illustrates the method operations performed in measuring the health characteristics for the selected the memory cell, for implementing embodiments of the present disclosure.

FIG. 3 is a flowchart diagram that illustrates the method operations 215 performed in measuring the health characteristics for the selected the memory cell 102A, for implementing embodiments of the present disclosure. In an operation 305, a health characteristic of the selected memory cell 102A is selected.

In an operation 310, the selected memory cell health characteristic is tested using a corresponding health characteristic test. The health characteristic test results are received in the memory controller 110 in an operation 315. The health characteristic test results can be stored in a memory cell health table 121.

Health characteristics can be determined using one or more of several different operating parameters of the memory cell. One example includes comparing increases in threshold voltage ($V_{Threshold}$) of the memory cell as function of the applied programming pulse. By way of example, if the memory cell gate voltage response to a selected number of programming pulses is lower or higher than a reference value then the programming parameters can be adjusted accordingly. Alternatively or additionally, additional programming pulses can be applied to the memory cell until the memory cell gate voltage attains the reference value. The total number of programming pulses needed for the memory cell gate voltage to attain the reference value can then be determined. If the total number of programming pulses exceeds a selected number of programming pulses could be used as an indication of memory cell health.

In another example, a high bit error rate caused after programming a test pattern into the memory array or a selected group of memory cells might also indicate that the selected memory cells are unhealthy. In certain instances, a high bit error rate may be an indication of a physical wordline failure such as broken (e.g., open) wordline, or a short between two or more wordlines.

Another memory cell health indication can be a leakage current higher than a selected reference value. The currents that are induced on neighboring memory cells can be measured when applying a programming voltage on target memory cell. In a different instance, the leakage on a target memory cell can be measured in an independent manner such as a specially induced operation and depending on programming operation on the target memory cell.

An analog compensation mechanism or neighboring memory cell interference mechanism can be used to determine the health of a memory cell(s). Analog compensation mechanism is an internal hardware or firmware mechanism that can adjust the verify level on the memory cell to compensate for the states of the neighboring memory cells. This adjustment could be tuned according to the health of the memory cells, for example as indicated from such measurement method described above. For example, an unhealthy memory cell may require a higher voltage correction measure on the verify level applied during programming.

If additional health characteristics for the selected memory cell remain to be tested in an operation 325, then a subsequent health characteristic is selected in an operation 330. The method operations then continue in operation 310 described above. If no additional health characteristics for the selected memory cell remain to be tested in operation 325, then the method operations continue in operation 220 as described above in FIG. 2 and which is described in more detail in FIG. 4 below.

Figure 4:
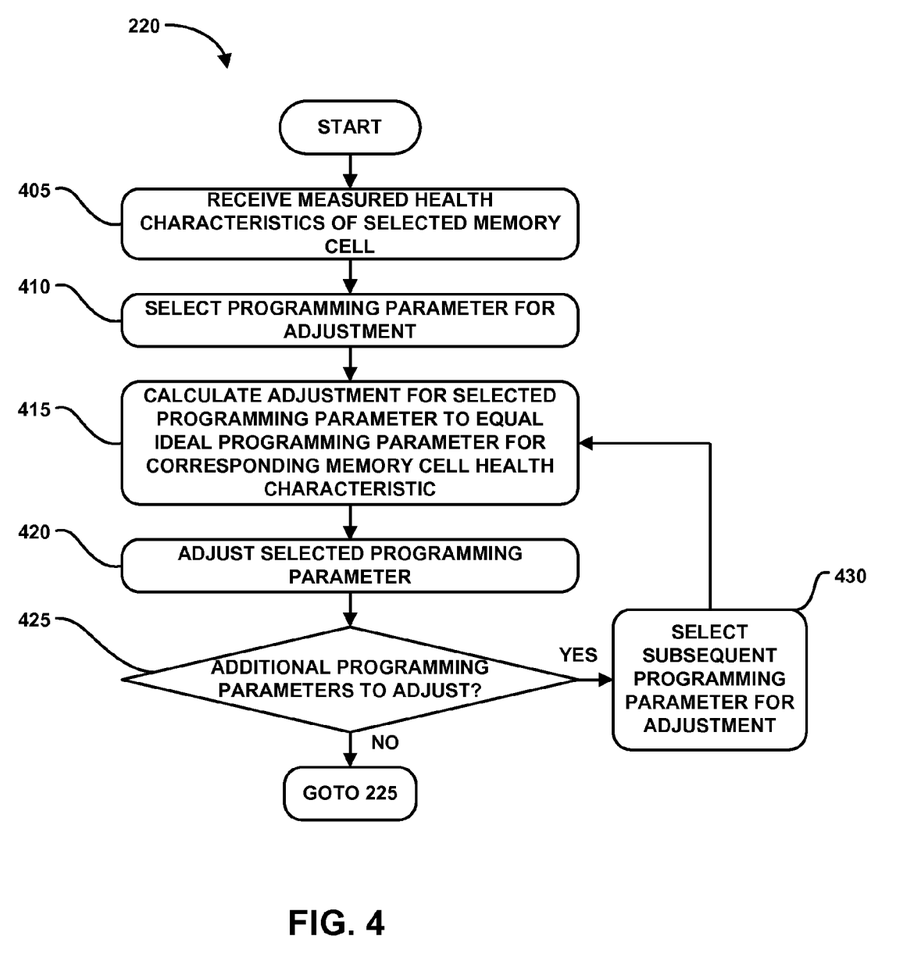
FIG. 4 is a flowchart diagram that illustrates the method operations performed in adjusting the programming parameters for the selected the memory cell, for implementing embodiments of the present disclosure.

FIG. 4 is a flowchart diagram that illustrates the method operations 220 performed in adjusting the programming parameters for the selected the memory cell 102A, for implementing embodiments of the present disclosure. In an operation 405, the measured health characteristics of the selected memory cell 102A are received in the memory controller 110. The memory controller 110 can write the received health characteristics of the selected memory cell 102A in corresponding entries in the memory cell health table 121.

In an operation 410, one of the programming parameters is selected for adjustment. In an operation 415, an adjustment is calculated for the selected programming parameter to equal an ideal programming parameter for the corresponding memory cell health characteristic. The ideal programming parameter corresponds to the selected goal of the programming parameter adjustment such as reducing noise generation during programming the selected memory cell.

In an operation 420, the selected programming parameter is adjusted according to the calculated adjustment. The resulting adjusted programming parameter can be stored in a corresponding entry in an adjusted programming parameter table 122.

If additional programming parameters remain to be adjusted for the selected memory cell in an operation 425, then a subsequent programming parameter is selected in an operation 430 and the method operations continue in operation 415 described above. If no additional programming parameters remain to be adjusted for the selected memory cell in operation 425, then the method operations continue in operation 225 as described above in FIG. 2.

A first example of a memory cell characteristic which can be correlated to the memory cell health is the background leakage current of the memory cell during a read/verify operation. A healthy memory cell should have background leakage current of below selected milliamps. A memory cell with a higher leakage current during a verify or a read operation can be identified as a low limit performance memory cell. A higher leakage current increases power consumption of the memory cell. The higher leakage current can also indicate that the operations of the target memory cell cannot be well controlled. A higher leakage current also limits the number of memory cells that can be handled at each operation without exceeding a total current available for that operation.

A second example of a memory cell characteristic which can be correlated to the memory cell health could be the number of programming pulses which are required to obtain a predetermined threshold for memory cell on state current value (Ion) in the selected memory cell.

Figure 5:
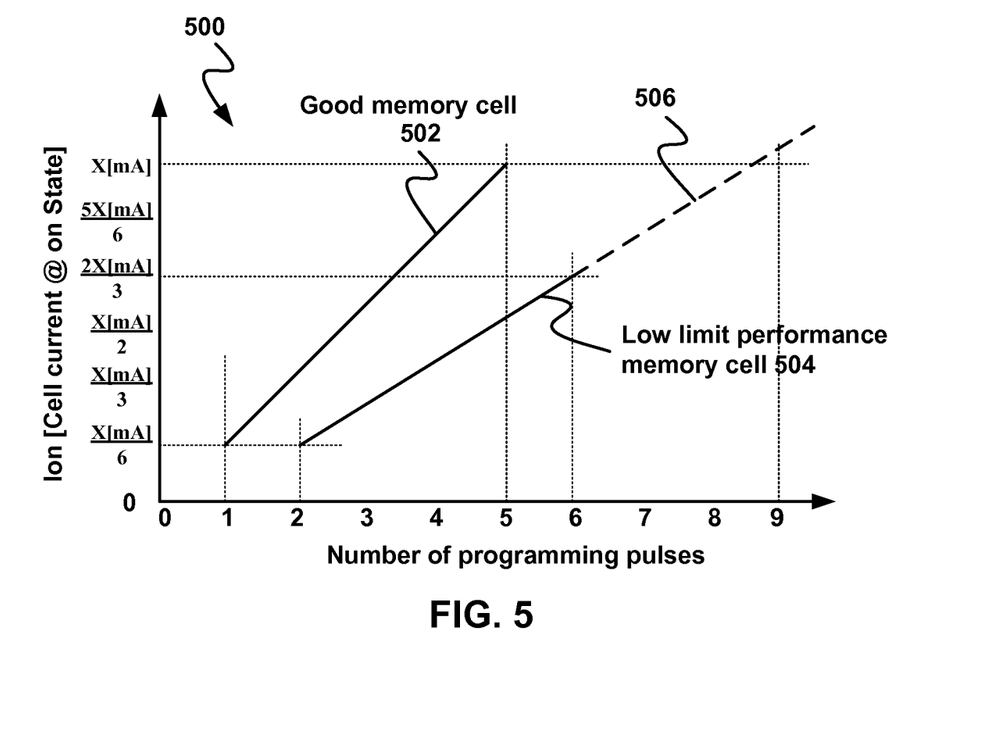
FIG. 5 is an illustrative graph of a number of programming pulses compared to a resulting memory cell on state current value (Ion), for implementing embodiments of the present disclosure.

FIG. 5 is an illustrative graph 500 of a number of programming pulses compared to a resulting memory cell on state current value (Ion), for implementing embodiments of the present disclosure. Graph 502 illustrates an example memory cell on state current value (Ion) compared to a number of programming pulses for a first memory cell to attain a memory cell on state current value (Ion) equal to or greater than a threshold value of about X[mA]. As shown after receiving about 5 programming pulses, the first memory cell has an on state current value (Ion) equal to or greater than a threshold value of about X[mA]. The first memory cell can be identified as a healthy memory cell if a healthy memory cell is defined as having a memory cell on state current value (Ion) equal to or greater than a threshold value of about X[mA] in 5 programming pulses or less.

In contrast, graph 504 illustrates an example memory cell on state current value (Ion) v. programming pulse graph for a second memory cell. After receiving about 5 programming pulses the second memory cell has a memory cell on state current value of about ½ X[mA]. The projected graph 506 of the second memory cell estimates about 9 programming pulses are needed before the second memory cell achieves a memory cell on state current value (Ion) equal to or greater than a threshold value of about X[mA].

The second memory cell can be identified as a slow or low limit performance memory cell because the second memory cell does not attain a memory cell on state current value ($I_{on}$) equal to or greater than a threshold value of about X[mA] in a selected number of programming pulses or less. By way of example if a selected memory cell requires more than 5 programming pulses to attain an on state current value ($I_{on}$) equal to or greater than a threshold value of 50 mA, then the memory cell could be a low limit performance memory cell. It should be noted that 5 programming pulses and a $I_{on}$ of 50 mA or more are arbitrarily chosen as an example decision point for determining whether a memory cell is a low limit performance memory cell or not and that more or fewer than 5 programming pulses and an $I_{on}$ of more or less than 50 mA could also be used.

A third example of a memory cell characteristic which can be correlated to the memory cell health is a response of the memory cell to a sample pre-programming voltage test pulse. The relevant memory cell characteristics measured during the test-pulse can include the background leakage current or the memory cell resistance. As an example, applying low voltage pulses on the target memory cell and measuring the response of the target memory cell such as measuring a change of threshold voltage ($V_{Threshold}$).

A third example of a memory cell characteristic which can be correlated to the memory cell health is reading the data currently placed in a memory cell or a group of memory cells and comparing to the correct data. The resulting bit error rate (fraction of flipped bits) is compared to a predetermined threshold. If the bit error rate is above the threshold the erroneous memory cells are identified as having a low limit performance and thus requiring a trimmed or adjusted programming sequence.

A fourth example of a memory cell characteristic which can be correlated to the memory cell health is programming a known data pattern into multiple memory cells and immediately reading the programmed data pattern from the memory cells. The programming parameters can then be adjusted to reduce the number of programming errors in the programmed data pattern. The programmed data pattern can be implemented in fixed logic circuits rather than in registers. The fixed logic circuits are less expensive than registers. Further, faster methods to check the number of errors in test pattern can also include writing all zero values to the memory cell array or selected group of memory cells, then write one values to only selected memory cell and counting as the one values will be the only memory cell bits that were flipped to indicate a one. The programmed data pattern can be implemented in registers or random access memory (RAM).

After identifying a low limit performance memory cell using one or more of the disclosed approaches described above, one or more of several programming parameter adjustments can be applied. The programming parameter adjustments include the number of programming pulses, the set/reset amplitude and duration, and the compliance current threshold values.

In one example, a low limit performance memory cell can be programmed with X*1.5 (or more) programming pulses where a good memory cell would require only X programming pulses. By way of example, if a typical number of programming pulses is 6 pulses, then a memory cell may be responsive and reliable if 9 or more programming pulses are used.

The set/reset amplitude can be adjusted. By way of example, between about 1 to about 8 programming pulses can be applied. Each of the programming pulses can have a smaller pulse intensity increase between each programming pulse. A typical programming pulse may increase in amplitude by 25 percent from one programming pulse to the next programming pulse. Adjusted programming pulse amplitude steps could increase in amplitude 10 percent from one programming pulse to the next.

In another implementation the duration of each of the programming pulses can be adjusted. By way of example, between about 1 to about 8 programming pulses can be applied. Each of the programming pulses can have a respective duration of between about 50 ns to about 250 ns, corresponding to the health of the memory cell indicated by the feedback. One or both of the duration and the amplitude of the programming pulses can be adjusted as may be desired. As an example, the amplitude increase steps can be a one or more volts such as a first programming pulse is 5 volts, a second programming pulse is 6 volts, a third programming pulse is 7 volts and so forth. The size of the programming pulse voltage steps can be constant or varying with each programming pulse.

Another adjustment that can be applied is to increase the applied compliance current during programming. An increased compliance current is expressed in higher data retention. Compliance current is the current limit applied to the memory cell during a set operation. The compliance current limits how much current or power is delivered to the memory cell to control the conductivity of the memory cell.

As described above, the feedback regarding the memory cell programming noise is provided prior to or during programming, and thus the memory cell programming noise can be reduced and more memory cells can be used, thus increasing the overall memory array data capacity. Prior art approaches of post memory cell programming noise feedback are ineffective at increasing overall memory array data capacity.

A memory cell having multiple low limit performance problems can also be reported to the operating system and/or memory system firmware. By way of example, a reported low limit performance memory cell(s) would include memory cell(s) that have multiple problems or are completely non-functional. The reported low limit performance memory cell(s) would then be excluded from further use by the operating system and/or the memory system firmware. By way of example, if the threshold of the leakage current was adjusted to a greater threshold leakage current and the leakage current of the suspect memory cell exceeds even the greater threshold leakage current, then the memory cell can be identified as having multiple problems and be excluded from further use as being unreliable.

Figure 6:
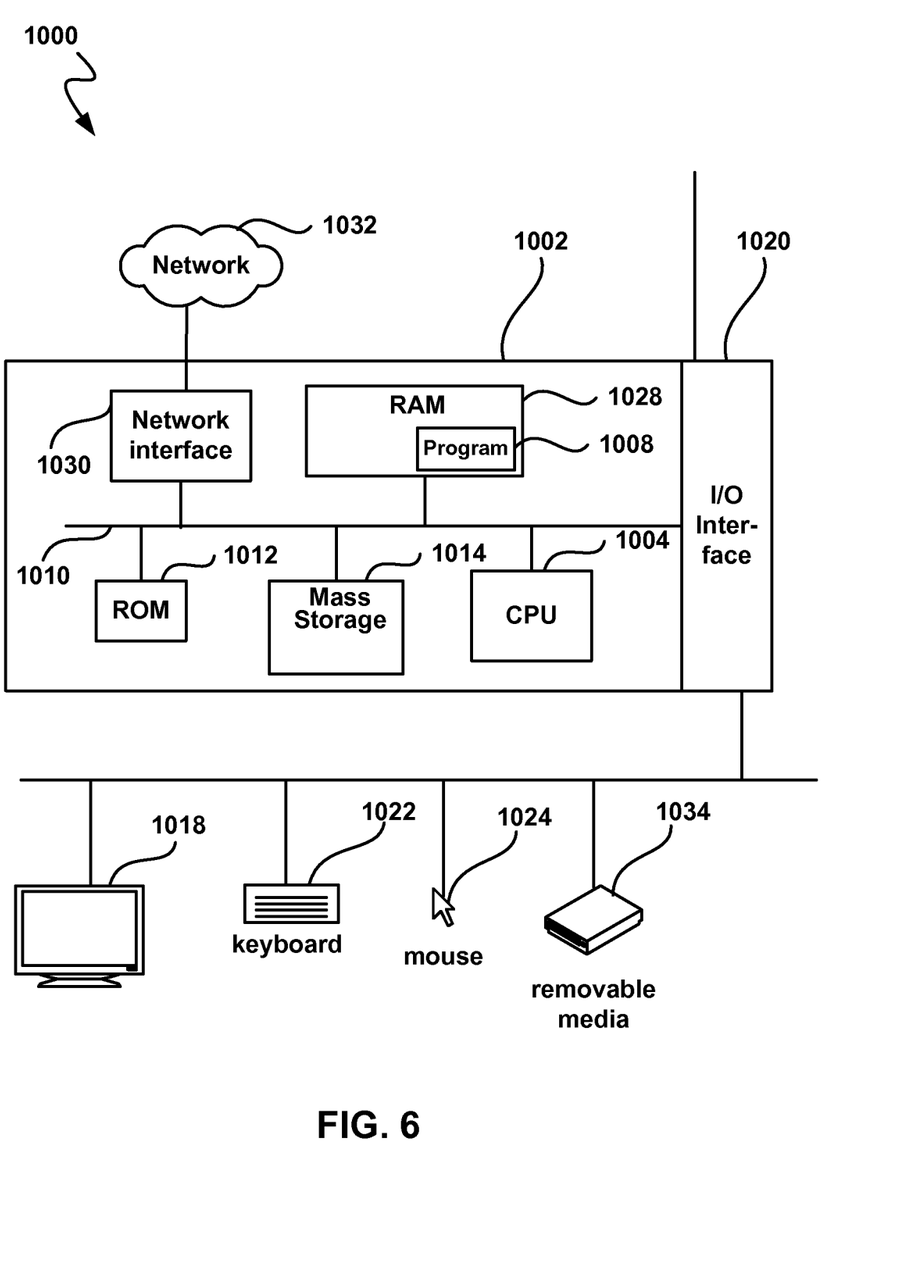
FIG. 6 is a block diagram of an example computer system, for implementing embodiments of the present disclosure.

FIG. 6 is a block diagram of an example computer system 1000, for implementing embodiments of the present disclosure. A general or specialized computer system, such as the computer system 1000, can be used as the host computer system 120 as described in FIG. 1, above and used for executing the operations for performing at least a portion of the analyses described above. The computer system 1000 includes a computer 1002, a display 1018, an optional printer or output device (not shown), a removable media (e.g., magnetic/optical/flash) drive 1034, a mass storage system 1014 (e.g., hard disk drive, solid state drive, or other suitable data storage device), a network interface 1030, and a keyboard 1022. Additional user interface devices such as a mouse 1024, a touch pad or touch screen can also be included.

The computer 1002 includes a central processing unit 1004, one or more data buses 1010, random access memory (RAM) 1028, read only memory (ROM) 1012, and an input/output interface 1020. The computer 1002 can be a personal computer (such as an IBM compatible personal computer, a Macintosh computer or Macintosh compatible computer), a workstation computer (such as a Sun Microsystems or Hewlett-Packard workstation), or some other suitable type of computer.

The CPU 1004 can be a general purpose digital processor or a specially designed processor. The CPU 1004 controls the operation of the computer system 1000. Using instructions retrieved from memory (e.g. program(s) 1008), the CPU 1004 controls the reception and manipulation of input data and the output and display of data on output devices.

The data buses 1010 are used by the CPU 1004 to access the RAM 1028, the ROM 1012 and the mass storage 1014. The RAM 1028 is used by the CPU 1004 as a general storage area and as scratch-pad memory, and can also be used to store input data and processed data. The RAM 1028 and the ROM 1012 can be used to store computer readable instructions or program code 1008 readable and executable by the CPU 1004 as well as other data.

The bus 1010 can also be used to access the input, output, and storage devices used by the computer 1002. These devices include the display 1018, the optional printer (not shown), the removable media drive 1034, and the network interface 1030. The input/output interface 1020 is used to receive input from keyboard 1022 and send decoded symbols for each pressed key to CPU 1004 over the data bus 1010.

The display 1018 is an output device that displays images of data provided by the CPU 1004 via the bus 1010 or provided by other components in the computer system 1000. The optional printer device, when operating as a printer, provides an image on a sheet of paper or a similar surface. Other output devices such as a plotter, projector, etc. can be used in place of, or in addition to, the printer device.

The removable media drive 1034 and the mass storage 1014 can be used to store various types of data. The removable media drive 1034 facilitates transporting such data to other computer systems, and mass storage 1014 permits fast access to large amounts of stored data. The mass storage 1014 may be included within the computer system or may be external to the computer system such as network attached storage or cloud storage accessible over one or more networks (e.g., local area networks, wide area networks, wireless networks, Internet 1032) or combinations of such storage devices and locations.

The CPU 1004 together with an operating system operate to execute computer readable code and logic and produce and use data. The computer code, logic and data may reside within the RAM 1028, the ROM 1012, or the mass storage 1014 or other media storage devices and combinations thereof. The computer code and data could also reside on a removable program medium and loaded or installed onto the computer system 1000 when needed. Removable program media include, for example, DVD, CD-ROM, PC-CARD, floppy disk, flash memory, optical media and magnetic disk or tape.

The network interface 1030 is used to send and receive data over a network 1032 connected to other computer systems. An interface card or similar device and appropriate software implemented by the CPU 1004 can be used to connect the computer system 1000 to an existing network and transfer data according to standard protocols such as local area networks, wide area networks, wireless networks, Internet and any other suitable networks and network protocols.

The keyboard 1022 is used by a user to input commands and other instructions to the computer system 1000. Other types of user input devices can also be used in conjunction with the present invention. For example, pointing devices such as a computer mouse, a track ball, a stylus, touch pad, touch screen or a tablet can be used to manipulate a pointer on a screen of a general-purpose computer.

It will be further appreciated that the instructions represented by the operations in the above figures are not required to be performed in the order illustrated, and that all the processing represented by the operations may not be necessary to practice the invention. It should also be appreciated that some operations may have sub-operations and in other instances, certain operations described herein may not be included in the illustrated operations. Further, the processes described in any of the above figures can also be implemented in software stored in any one of or combinations of the RAM, the ROM, or the hard disk drive.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

One of skill in the art will recognize that this invention is not limited to the two dimensional and three dimensional exemplary structures described but cover all relevant memory structures within the spirit and scope of the invention as described herein and as understood by one of skill in the art.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of programming user data into a memory cell comprising:
    selecting a memory cell in a memory system by a memory controller;
    measuring at least one of a plurality of health characteristics of the selected memory cell in a health characterization logic;
    adjusting at least one of a plurality of programming parameters of the selected memory cell by a programming parameter adjust logic; and
    programming a received first user data to the selected memory cell using the adjusted at least one of said plurality of programming parameters corresponding to the selected memory cell by a programming circuit;
    wherein the measuring, the adjusting, and the programming occur in immediate succession when the selected memory cell is selected for programming the first user data.

2. The method of claim 1, wherein the selected memory cell is one of a group of memory cells, each of the group of memory cells having a common relationship.

3. The method of claim 2, wherein the common relationship includes at least one of:
    a similar access frequency; or
    a similar average bit error rate; or
    a neighboring memory cells; or
    memory cells sharing a common physical structure including a common gate lines or a common drain or a common source or are disposed within a selected distance; or
    memory cells having a similar time in service; or
    memory cells having a common temperature; or
    memory cells having common electrical properties.

4. The method of claim 2, wherein adjusting the at least one of the plurality of programming parameters of the selected memory cell by the programming parameter adjust logic includes adjusting the at least one of the plurality of programming parameters of the group of memory cells; and
    further comprising: storing the adjusted at least one programming parameter for the group of memory cells.

5. The method of claim 3, further comprising:
    receiving a second user data to be programmed, the second user data being received in the memory controller;
    selecting the group of memory cells; and
    programming the second user data to the group of memory cells using the stored, adjusted at least one programming parameter for the group of memory cells.

6. The method of claim 1, wherein programming the first user data to a second memory cell uses the adjusted at least one programming parameter corresponding to the selected memory cell for programming by a programming circuit, wherein the second memory cell shares a common wordline with the selected memory cell.

7. The method of claim 1, wherein the measuring the at least one of the plurality of health characteristics of the selected memory cell, the adjusting the at least one of the plurality of programming parameters of the selected memory cell and the programming the first user data to the selected memory cell occur after at least one of a selected number of programming cycles for the selected memory cell or a selected period of time in service for the selected memory cell.

8. The method of claim 1, wherein measuring the at least one of the plurality of health characteristics of the selected memory cell includes:
    selecting the at least one of the plurality of health characteristics of the selected memory cell;
    applying a test corresponding to the selected at least one of the plurality of health characteristic; and
    receiving a measured selected health characteristic.

9. The method of claim 8, wherein adjusting the at least one of the plurality of programming parameters of the selected memory cell includes:
    selecting at least one of the plurality of programming parameters of the selected memory cell for adjustment;
    calculating an adjustment for the selected at least one of the plurality of programming parameters of the selected memory cell corresponding to a target programming result for the selected memory cell; and
    adjusting the selected at least one of the plurality of programming parameters of the selected memory cell corresponding to a target programming result for the selected memory cell.

10. The method of claim 1, wherein the plurality of programming parameters includes at least one of:
    a programming pulse width;
    a programming pulse amplitude;
    a programming pulse step size;
    a selected number of programming pulses;
    a voltage applied to neighboring wordlines or other group of related memory cells when the selected memory cell is programmed;
    an analog equalizer parameter; or
    a compliance current.

11. The method of claim 1, wherein the adjusting at least one of the plurality of programming parameters of the selected memory cell includes disabling the selected memory cell when the adjusted at least one of the plurality of programming parameters does not result in a reliable first data stored in the selected memory cell.

12. A method of programming user data into a memory cell array comprising:
    receiving a first user data to be programmed, the first user data being received in a memory controller;
    selecting a plurality of memory cells from the memory array for programming the first user data by the memory controller;
    measuring at least one of a plurality of health characteristics of the selected plurality of memory cells in a health characterization logic;
    adjusting at least one of a plurality of programming parameters of the selected plurality of memory cells by a programming parameter adjust logic;
    programming the first user data to the selected plurality of memory cells using the adjusted at least one programming parameter corresponding to the selected plurality of memory cells by a programming circuit;
    wherein the measuring the at least one of the plurality of health characteristics of the selected plurality of memory cells, the adjusting the at least one of the plurality of programming parameters of the selected plurality of memory cells and the programming the first user data to the selected plurality of memory cells occur in immediate succession just before programming and after at least one of a selected number of programming cycles for the selected memory cell or a selected period of time in service for the selected plurality memory cells, wherein each one of the selected plurality of memory cells share a common wordline.

13. A memory system comprising:
a memory controller;
a memory array including a plurality of memory cells, the memory array being coupled to the memory controller by a bus;
a health characterization logic including logic for measuring at least one of a plurality of health characteristics of a selected memory cell of the plurality of memory cells;
a programming parameter adjust logic including logic for adjusting at least one of a plurality of programming parameters of the selected memory cell; and
a programming circuit including logic for programming the first user data to the selected memory cell using the adjusted at least one programming parameter corresponding to the selected memory cell;
wherein the logic measuring the at least one of the plurality of health characteristics of the selected memory cell, the logic for adjusting the at least one of the plurality of programming parameters of the selected memory cell and the logic for programming the first user data to the selected memory cell include logic to execute in immediate succession when the selected memory cell is selected for programming the first user data.

14. The memory system of claim 13, wherein the programming parameter adjust logic is included in a common die with the memory array.

15. The memory system of claim 13, wherein the health characterization logic is included in a common die with the memory array.

16. The memory system of claim 13, wherein the logic for measuring the at least one of the plurality of health characteristics of the selected memory cell includes:
logic for selecting the at least one of the plurality of health characteristics of the selected memory cell;
logic for applying a test corresponding to the selected at least one of the plurality of health characteristic; and
logic for receiving a measured selected health characteristic.

17. The memory system of claim 16, wherein the logic for adjusting the at least one of the plurality of programming parameters of the selected memory cell includes:

logic for selecting at least one of the plurality of programming parameters of the selected memory cell for adjustment;
logic for calculating an adjustment for the selected at least one of the plurality of programming parameters of the selected memory cell corresponding to a target programming result for the selected memory cell; and
logic for adjusting the selected at least one of the plurality of programming parameters of the selected memory cell corresponding to a target programming result for the selected memory cell.

18. The system of claim 13, wherein the logic for measuring the at least one of the plurality of health characteristics of the selected memory cell, the logic for adjusting the at least one of the plurality of programming parameters of the selected memory cell and the logic for programming the first user data to the selected memory cell includes logic for executing after at least one of a selected number of programming cycles for the selected memory cell or a selected period of time in service for the selected memory cell.

19. A method of programming user data into a memory cell comprising:
selecting a memory cell in a memory system;
measuring at least one of a plurality of health characteristics of the selected memory cell, for said at least one of the plurality of health characteristic performing a test and capturing results from said test;
adjusting at least one of a plurality of programming parameters for the selected memory cell based on the measuring; and
programming user data to the selected memory cell using the adjusted at least one said plurality of programming parameters;
wherein the measuring, the adjusting, and the programming occur in immediate succession after the selected memory cell is selected for programming;
wherein the plurality of programming parameters includes at least one of a programming pulse width, or a programming pulse amplitude, or a programming pulse step size, or a selected number of programming pulses, or a voltage applied to neighboring wordlines or other group of related memory cells when the selected memory cell is programmed, or an analog equalizer parameter, or a compliance current.

* * * * *